United States Patent [19]
Takemura et al.

[11] Patent Number: 5,126,178
[45] Date of Patent: Jun. 30, 1992

[54] WAFER PROCESSING FILM

[75] Inventors: Yasuo Takemura; Osamu Narimatsu; Kazuyoshi Komatsu; Yoko Takeuchi, all of Nagoya, Japan

[73] Assignee: Misui Toatsu Chemicals, Tokyo, Japan

[21] Appl. No.: 654,962

[22] Filed: Feb. 14, 1991

[30] Foreign Application Priority Data

Feb. 14, 1990 [JP] Japan .................... 2-031375

[51] Int. Cl.⁵ .............................. C09J 7/02
[52] U.S. Cl. ..................... 428/40; 428/219; 428/220; 428/354
[58] Field of Search .......... 428/40, 343, 354, 219, 428/220

[56] References Cited

U.S. PATENT DOCUMENTS 4,756,968  7/1988  Ebe .................... 428/345
4,853,286  8/1989  Narimatsu et al. ......... 428/343

Primary Examiner—Alexander S. Thomas
Attorney, Agent, or Firm—Cushman, Darby and Cushman

[57] ABSTRACT

The present invention provides a water processing film fitted on one side of the base film with a pressure-sensitive adhesive layer and further with a release film on the surface of the pressure-sensitive adhesive layer, and coated on the back side of the base film a phosphoric surfactant wherein ionic components are not detected by ion chromatography, and can prevent failure of an integrated circuit dye static electricity generated in the handling of the wafer processing film and can also inhibit contamination and corrosion of the wafer by surfactant.

22 Claims, 1 Drawing Sheet

WAFER PROCESSING FILM

BACKGROUND OF THE INVENTION

1. Field of the Invention

The present invention relates to a semiconductor wafer processing film consisting of a base film, pressure-sensitive adhesive layer, release film and surfactant layer. More particularly, the invention relates to a wafer processing film which can prevent failure caused by static electricity and can also inhibit contamination and corrosion of the wafer.

2. Description of the Related Art

A semiconductor integrated circuit (IC) is manufactured by slicing a single crystal of silicon to obtain a wafer, followed by installing an integrated circuit through etching and then passing through steps such as dicing, washing, drying, expanding and pick up. A wafer processing film has been used in order to prevent failure of the wafer during these steps and to carry out fabrication with ease. However, static electricity generated by the handling of the wafer processing film in these steps sometimes damages the semiconductor integrated circuit on the wafer by electric discharge.

A method for fitting a destaticizer such as an antistatic bar on the wafer processing film or a method for blowing ionized air to temporarily destaticize the wafer are employed in order to prevent these problems. These methods, however, are not very effective and have a disadvantage of making the steps complex.

In order to improve these drawbacks, Japanese Laid-Open Patent 80834 (1986) has proposed a method for adding electrically conductive substances such as metal powder to either or both of a substrate material and pressure-sensitive adhesive itself, thereby making the adhesive film conductive and thereby preventing generation of static electricity. The method, however, leads to contamination of the wafer surface by the electrically conductive substances contained in the pressure-sensitive adhesive and causes such adverse effects as corrosion of the wafer.

Japanese Laid-Open Patent 191777 (1983) has disclosed a method for preventing electrification by addition of surfactant to adhesive. The method, however, brings surfactant contained in the adhesive into direct contact with the surface of the wafer and thereby contaminating the wafer.

OBJECT AND SUMMARY OF THE INVENTION

An object of the present invention is to provide a semiconductor wafer processing film which can protect the semiconductor wafer from contamination and corrosion by surfactants and other substances.

Another object of the present invention is to prevent failure of a semiconductor integrated circuit due to static electricity by inhibiting generation of static electricity and electrification in the handling of the wafer processing film and also by inhibiting the time-dependent decrease in antistatic effect.

The above objects of the present invention can be accomplished by providing a semiconductor wafer processing film fitted on one side of a base film with a pressure-sensitive adhesive layer and further with a release film on the surface of said pressure-sensitive adhesive layer, comprising coating a phosphoric acid based surfactant which contains ionic components in less than detectable amount by ion chromatography on the back side of said base film in an amount of 0.5 to 1000 mg/m$^2$.

The wafer processing film of the present invention consists of a base film, pressure-sensitive adhesive layer and a release film and is particularly characterized by coating the phosphoric acid based surfactant on the back side of said base film.

Figure 1:
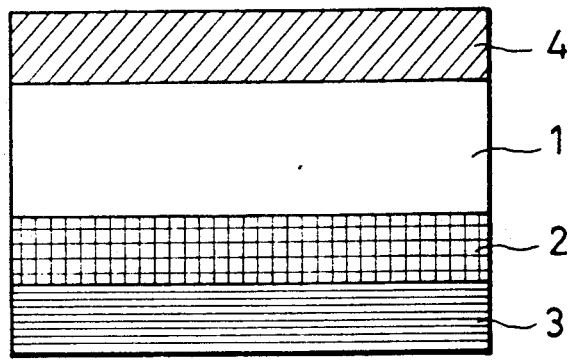
FIG. 1 illustrates a sectional view of the wafer processing film of the present invention.

In the drawing, the base film 1 is fitted with a pressure-sensitive adhesive layer 2 on one side and further laminated on the surface of the adhesive layer 2 with a release film 3. A surfactant layer 4 is fitted on the other side of the base film which is on the opposite side from the pressure-sensitive adhesive layer 2.

DETAILED DESCRIPTION OF THE INVENTION

For an understanding of the wafer processing film of the invention, an example of preparation will be illustrated according to FIG. 1.

As illustrated in FIG. 1, the pressure-sensitive adhesive is coated on one side of the base film 1 and dried to form the pressure-sensitive adhesive layer 2. Then, the release film 3 is mounted on the surface of the pressure-sensitive adhesive layer 2. Further, the phosphoric acid based surfactant is coated on the back side of the base film 1 and dried to form the surfactant layer 4. Thus the wafer processing film is completed.

Generally, the wafer processing film is transported and stored in the form of a roll, folding or stack of cuttings which have prescribed dimensions.

Even in a rolled, folded or stacked state, the wafer processing film of the invention does not bring the pressure-sensitive adhesive layer 2 into contact with the surfactant layer 4 because the release film 3 is present between both layers.

Consequently, in the fabrication of the wafer, the release film 3 is removed from the wafer processing film and the base film 1 having the surfactant layer 4 can be mounted on the wafer by means of the pressure-sensitive adhesive layer 2 without contamination or corrosion of the wafer by the surfactant layer 4.

Further, electrification of the wafer processing film is inhibited by the surfactant layer 4 and hence the integrated circuit on the wafer is not damaged by static electricity.

Exemplary raw materials for use in the base film of the invention include polyethylene, ethylenevinyl acetate copolymer (hereinafter referred to as EVA) and other ethylene copolymers, polypropylene and plasticized polyvinyl chloride.

The thickness of the base film can be optionally determined depending upon the conditions such as shape and surface state of the wafer to be protected and the grinding method used. Preferred thickness is usually from 10 to 2000 $\mu$m and more preferred thickness is from 50 to 200 $\mu$m.

The pressure-sensitive adhesive used for the wafer processing film of the invention includes, for example, acryl base, vinyl base and rubber base adhesives which are commercially available. Acryl base pressure-sensitive adhesive includes, for example, "Bonron" (Trademark of Mitsui Toatsu chemicals Inc.). However, in view of corrosion inhibition of the wafer, an aqueous emulsion type pressure-sensitive adhesive is preferred, that is polymerized with a polymerization initiator which substantially does not contain strongly corrosive ions.

The term "polymerization initiator which substantially does not contain strongly corrosive ions" means that the aqueous emulsion type pressure-sensitive adhesive contains less than 50 ppm by weight of metal ions having a high ionization tendency, such as sodium and potassium as catalyst residue or decomposition products. Such ions also include ions which form strong acids such as sulfuric acid, hydrochloric acid and nitric acid.

The content of these ions exceeding 50 ppm by weight leads to unfavorable corrosion of the wafer by the pressure-sensitive adhesive.

Exemplary polymerization initiators which substantially do not contain strongly corrosive ions is water soluble azo compound, which have a solubility of 0.1 g or more in 100 g water at a temperature of polymerization reaction, preferably 1 g or more solubility in 100 g water. Particularly preferred azo compounds are water soluble azo compounds such as 4,4'-azobiscyanopentanoic acid having a solubility of 1.8 g/100 g water at a temperature of 60° C. If the applied solubility of the polymerization initiator used in the invention is less than 0.1 g/100 g water, it cannot give desired stable emulsion.

The application of the pressure-sensitive adhesive to the base film can be carried out by conventionally known methods, for example, a roll coater method, gravure roll method and bar coat method. The amount of the pressure-sensitive adhesive applied is in the range of generally from 1 to 200 g/m$^3$ preferably from 5 to 50 g/cm$^2$.

The release film which can be used for the invention includes, for example, films of synthetic resin such as polyolefin, polyester and polyamide. The thickness of the release film is usually from 10 to 500 μm, preferably from 20 to 200 μm.

The phosphoric acid based surfactant of the invention, such that the ionic component is not detected by ion chromatography, is an alkyl phosphoric acid ester and/or its salt and an alkyl ether phosphoric acid ester and/or its salt.

The alkyl phosphoric acid ester and/or its salt is prepared by reacting a higher alcohol with a phosphorating agent such as phosphorus pentoxide, phosphorus oxychloride or phosphorus trichloride to obtain phosphoric acid ester and neutralizing the residual acidic hydroxyl groups with a base.

The alkyl ether phosphoric acid ester and/or its salt is prepared by reacting a terminal group of a polyoxyethylene derivative of higher alcohol with a phosphorating agent such as phosphorus pentoxide, phosphorus oxychloride and phosphorus trichloride to obtain phosphoric acid ester and neutralizing the residual acidic hydroxyl groups with a base.

Mono-, di- and tri-ester are obtained in the alkyl phosphoric acid ester and/or its salt and the alkyl ether phosphoric acid ester and/or its salt. They may be used singly or as a mixture of them in the invention.

The alkyl phosphoric acid ester and/or its salt and the alkyl ether phosphoric acid ester and/or its salt have alkyl groups of preferably from 8 to 18 carbon atoms, more preferably from 10 to 14 carbon atoms to better obtain the antistatic effect. Further, the alkyl ether phosphoric acid ester and/or its salt has an ethylene oxide addition mole number of preferably from 2 to 8, more preferably from 3 to 5.

The base used for neutralizing acidic hydroxyl groups is preferably ammonia, organic amines or amino alcohols. Preferred bases for use include, for example, ammonia, trimethylamine and triethanolamine. The salts obtained by neutralizing with these bases are preferred because of almost no corrosivity.

The phosphoric acid based surfactant obtained by neutralizing with sodium hydroxide or potassium hydroxide contains metal ions having a high ionization tendency. These metal ions are detected by ion chromatography and unfavorably cause corrosion of the wafer.

In the present invention, the term "phosphoric acid based surfactant which contains ionic components in less than detectable amount by ion chromatography" means that ionic components are not detected in the analysis of the phosphoric acid based surfactant according to an analytical method of ion chromatography having a detection limit of 1 ppm by weight.

The surfactant which can be used in the invention, that is, the phosphoric acid based surfactant wherein ionic components are not detected by ion chromatography is assumed to constitute a polar center in the surfactant-water system by forming a hydrogen bond to a water molecule and to maintain continuity by further extending the hydrogen bond to other water molecules. Thus the surfactant exhibits excellent antistatic effects.

The applied amount of the phosphoric acid based surfactant used in the invention is in the range of usually from 0.5 to 1000 mg/m$^2$, preferably from 1 to 100 mg/m$^2$ The applied amount less than 0.5 mg/m$^2$ cannot give the desired antistatic effect. On the other hand, the amount exceeding 1000 mg/m$^2$ results in poor drying efficiency after application and residual tackiness and thereby leads to inferior workability and undesirable cost increase.

The method for applying the surfactant to the back side of the base film is preferably to dilute the surfactant with a solvent such as isopropyl alcohol and to coat it with a sponge roll. Conventionally known methods are, for example, a roll coater method, a gravure coater method and a bar coat method.

To the extent that they do not impair the object of the invention, nonionic surface active agents such as polyoxyethylene alkyl ether and polyoxyethylene alkyl ester may be mixed with the phosphoric acid based surfactant wherein ionic components are not detected by ion chromatography. The amount of nonionic surface active agents which can be mixed is preferably 50 parts by weight or less per 100 parts by weight of said phosphoric acid based surfactant. The amount exceeding 50 parts by weight is unfavorable because antistatic effect decreases time-dependently.

The present invention will hereinafter be illustrated further in detail by way of examples.

In the examples of the present invention, the physical properties and performances of the wafer processing film were evaluated by the following methods.

Amount of static electricity generation:

The wafer processing film is cut into a width of 25 mm to prepare a test specimen.

A digital electric potential measuring apparatus KSD-6110 manufactured by Kasuga Denki Co., Ltd. is used.

Under conditions of 50 mm in spacing between the specimen and apparatus, 23±2° C. in measuring temperature and 60±5% in relative humidity, the amount of static electricity generation during peeling of the release film from the wafer processing film at a peeling rate of 1000 mm/min is measured at immediately after application, and after 10 days, 20 days and 30 days.

Content of ionic components:

Each 1 g of surfactant to be used in the examples, respectively, is collected and diluted 1000 times with demineralized water. The content of ions in the diluted solution is measured by the below described ion chromatography. The content of ions is a weight of ion (μg) contained in 1 g of the surfactant. The limit of ion detection by the method is 1 ppm by weight.

Measuring apparatus of ion chromatography:

The apparatuses used are manufactured by DIONEX Co., Ltd. and include:

(1) the anion pre/concentration column (HPIC-AG4A);

(2) the anion separation column (HPIC-AS4A);

(3) the cation pre/concentration column (HPIC-CG3); and (4) the cation separation column (HPIC-CS4).

Evaluation on wafer corrosion:

Release film is peeled from the wafer processing film. Pressure-sensitive adhesive film is mounted on the wafer and allowed to stand for 1000 hours under conditions of 50° C. × 90% RH. Then the pressure-sensitive adhesive film is peeled off and the corroded state of the wafer surface is observed under a microscope.

Break-down voltage:

Release film is removed from the wafer processing film, pressure-sensitive adhesive film is mounted on the wafer, and allowed to stand for 500 hours at conditions of 23° C. × 50% RH. Thereafter said pressure-sensitive adhesive film is peeled off. Voltage is applied between terminals of the semiconductor circuit (IC) and gradually raised. The voltage at which the IC breaks is measured.

When the aluminum bonding pad is disconnected due to corrosion or for other reasons, the breakdown voltage lowers or no electric current is passed through the circuit.

EXAMPLE 1

Commercially available ethylene-vinyl acetate copolymer film (ethylene/vinyl acetate mole ratio is 90/10) having a thickness of 200 μm was used as a base film. Corona discharge treatment was carried out on one side of the base film. Thereafter an acryl base pressure-sensitive adhesive "Bonron" (Trade mark of Mitsui Toatsu Chemicals Inc.) was applied to the treated surface by using a roll coater and dried to install a pressure-sensitive adhesive layer having a thickness of 50 μm.

Commercially available polypropylene film having a thickness of 50 μm was used as a release film. The polypropylene film was mounted on the surface of the pressure-sensitive adhesive layer to prepare a wafer processing film consisting of three layers, i.e., base film, pressure-sensitive adhesive layer and release film.

A surfactant, triethanolamine salt of alkyl ether phosphoric acid ester "MNT-F-695" (Trade Mark of Marubishi Yuka Kogyo Co., Ltd.) was diluted 100 times with isopropyl alcohol. The solution obtained was applied with a sponge roll to the back side of the base film in the above wafer processing film so as to obtain a coating amount of 30 mg/m$^2$ and dried.

The coated film was successively taken off with a wind-up machine to prepare a roll of the wafer processing film having a length of 100 m.

The amount of static electricity generated in peeling off the release film from the wafer processing film and the above various kinds of performance obtained by mounting the wafer processing film on the wafer were evaluated. Results are illustrated in Table 1. The ion content of the above surfactant was measured and results are illustrated in Table 2.

EXAMPLE 2

To a mixture composed of 150 parts by weight of deionized water and 2 parts by weight of polyoxyethylene nonylphenyl ether, a monomer mixture composed of 70 parts by weight of 2-ethylhexyl acrylate, 25 parts by weight of methyl methacrylate, 3 parts by weight of methacrylic acid and 2 parts by weight of glycidyl methacrylate were added. The mixture thus obtained was polymerized at 70° C. by using 0.5 part by weight of 4,4'-azobiscyanopentanoic acid as a polymerization initiator to obtain an acryl-base pressure-sensitive adhesive emulsion having a solid content of about 40% by weight.

A wafer processing film was obtained by carrying out the same procedures as described in Example 1 except that the pressure-sensitive adhesive obtained above was used.

Physical properties and performance were evaluated as described in Example 1. Results are illustrated in Tables 1 and 2.

EXAMPLE 3

Commercially available low density polyethylene film having a thickness of 60 μm was used as a base film. Corona discharge treatment was carried out on one side of the base film. Thereafter an acryl base pressure-sensitive adhesive "Bonron" (Trade Mark of Mitsui Toatsu Chemicals Inc.) was applied to the treated surface by using a roll coater and dried to install a pressure-sensitive adhesive layer having a thickness of 50 μm.

Commercially available polypropylene film having a thickness of 50 μm was used as a release film. The polypropylene film was mounted on the surface of the pressure-sensitive adhesive layer to prepare a wafer processing film.

A surfactant, triethanolamine salt of alkyl ether phosphoric acid ester "MNT-F-695" (Trade Mark of Marubishi Yuka Kogyo Co., Ltd.) was diluted 15 times with isopropyl alcohol. The solution obtained was applied with a gravure roll to the back side of the base film in the above wafer processing film so as to obtain a coating amount of 80 mg/m$^2$ and dried. The coated film was successively taken off with a wind-up machine to prepare a roll of the wafer processing film having a length of 100 m.

Physical properties and performance of the wafer processing film thus obtained were evaluated as described in Example 1. Results are illustrated in Tables 1 and 2.

EXAMPLE 4

A wafer processing film was obtained by carrying out the same procedures as described in Example 3 except that trimethylamine salt of alkyl phosphoric acid ester having alkyl groups which are primarily composed of dodecyl groups was used.

Physical properties and performance of the wafer processing film thus obtained were evaluated as described in Example 3. Results are illustrated in Tables 1 and 2.

COMPARATIVE EXAMPLE 1

A wafer processing film was prepared by carrying out the same procedures as described in Example 1 without applying the surfactant to the back side of the base film.

Physical properties and performance of the wafer fabricating film thus obtained were evaluated as described in Example 1. Results are illustrated in Tables 1 and 2.

COMPARATIVE EXAMPLE 2

A wafer processing film was prepared by carrying out the same procedures as described in Example 1 except that the coating amount of the surfactant was 0.3 mg/m².

Physical properties and performance of the wafer processing film thus obtained were evaluated as described in Example 1. Results are illustrated in Tables 1 and 2.

COMPARATIVE EXAMPLE 3

A wafer processing film was prepared by carrying out the same procedures as described in Example 1 except that a sorbitan base fatty acid ester surfactant "Denon 733" (Trade mark of Marubishi Yuka Kogyo Co., Ltd.) was used in a coating amount of 50 mg/m².

Physical properties and performance of the wafer processing film thus obtained were evaluated as described in Example 1. Results are illustrated in Tables 1 and 2.

COMPARATIVE EXAMPLE 4

A wafer processing film was prepared by carrying out the same procedures as described in Example 1 except that sodium salt of alkyl ether phosphoric acid ester which was obtained by neutralizing with sodium hydroxide and had alkyl groups primarily composed of dodecyl groups and an average ethylene oxide addition number of 3 was used as the surfactant in a coating amount of 50 mg/m².

Physical properties and performance of the wafer processing film thus obtained were evaluated as described in Example 1. Results are illustrated in Tables 1 and 2.

TABLE 1

|  |  | Example | | | | Comparative Example | | | |
|---|---|---|---|---|---|---|---|---|---|
|  |  | 1 | 2 | 3 | 4 | 1 | 2 | 3 | 4 |
| Amount of static electricity generation (kV) | Initial | 0.1 | 0.1 | 0.1 | 0.1 | 2.7 | 1.0 | 0.1 | 0.1 |
|  | After 10 days | 0.1 | 0.1 | 0.1 | 0.1 | 2.8 | 1.2 | 0.7 | 0.1 |
|  | After 30 days | 0.1 | 0.1 | 0.1 | 0.1 | 2.7 | 1.5 | 2.0 | 0.1 |
|  | After 60 days | 0.1 | 0.1 | 0.1 | 0.1 | 2.8 | 2.0 | 2.5 | 0.1 |
| Evaluation on wafer corrosion |  | not found | not found | not found | not found | not found | not found | not found | found |
| Break-down voltage (V) |  | 22 | 22 | 22 | 22 | 5 | 7 | 5 | 5 |

TABLE 2

|  |  | Example | | | | Comparative Example | | | |
|---|---|---|---|---|---|---|---|---|---|
|  |  | 1 | 2 | 3 | 4 | 1 | 2 | 3 | 4 |
| Content of ionic comp. (wt ppm) | Na⁺ | ND | ND | ND | ND | — | ND | ND | 3 |
|  | K⁺ | ND | ND | ND | ND | — | ND | ND | 2 |
|  | Cl⁻ | ND | ND | ND | ND | — | ND | ND | 3 |
|  | NO₃⁻ | ND | ND | ND | ND | — | ND | ND | ND |
|  | PO₄³⁻ | ND | ND | ND | ND | — | ND | ND | ND |
|  | SO₄²⁻ | ND | ND | ND | ND | — | ND | ND | ND |

Note
ND means content of less than 1 ppm by weight.

What is claimed is:

1. A wafer processing film comprising:
   a base film;
   a pressure-sensitive adhesive layer coating a first side of said base film;
   a release film on a surface of said pressure-sensitive adhesive layer;
   a phosphoric acid based surfactant coating a second side of said base film, wherein said surfactant is not in direct contact with said wafer 2. A wafer processing film according to claim 1, wherein said phosphoric acid based surfactant comprises:
   ionic components in an amount which is undetectable by ion chromatography.

3. A wafer processing film according to claim 1 wherein said phosphoric acid based surfactant is a compound selected from the group consisting of:
   (A) an alkyl phosphoric acid ester;
   (B) an alkyl phosphoric acid ester salt;
   (C) said alkyl phosphoric acid ester and said alkyl phosphoric acid ester salt;
   (D) an alkyl ether phosphoric acid ester;
   (E) an alkyl ether phosphoric acid ester salt; and
   (F) said alkyl ether phosphoric acid ester and said alkyl ether phosphoric acid ester salt.

4. A wafer processing film according to claim 3, wherein,
   said compound is obtained by reacting a higher alcohol or a terminal group of a polyoxyethylene derivative of a higher alcohol with a phosphorating agent and neutralizing residual acidic hydroxyl groups with a base and
   said phosphorating agent is a compound selected from the group consisting of phosphorus pentoxide, phosphorus oxychloride and phosphorus trichloride.

5. A wafer processing film according to claim 3 wherein an alkyl group in said alkyl phosphoric acid ester and said alkyl phosphoric acid ester salt has a carbon number in the range from 8 to 18.

6. A wafer processing film according to claim 4 wherein said base used for neutralizing said residual acidic hydroxyl groups is a compound selected from the group consisting of ammonia, organic amine and amino alcohol.

7. A wafer processing film according to claim 3 wherein an alkyl group in said alkyl ether phosphoric acid ester and said alkyl ether phosphoric acid ester salt has a carbon number in the range from 8 to 18.

8. A wafer processing film according to claim 3 wherein said alkyl ether phosphoric acid ester and said alkyl ether phosphoric acid ester salt has an ethylene oxide addition mole number in the range from 2 to 8.

9. A wafer processing film according to claim 1 wherein said surfactant on said second side is in an amount of from 1 to 100 mg/m$^2$.

10. A wafer processing film according to claim 1 wherein the material which comprises said pressure-sensitive adhesive layer is a material selected from the group consisting of acryl base, vinyl base and rubber base.

11. A wafer processing film according to claim 10 wherein said pressure-sensitive adhesive layer comprises an aqueous emulsion polymerized with a polymerization initiator with substantially no strongly corrosive ions.

12. A wafer processing film according to claim 11 wherein said polymerization initiator with substantially no strongly corrosive ions comprises a water soluble azo compound.

13. A wafer processing film according to claim 12 wherein said polymerization initiator comprises 4,4'-azobiscyanopentanoic acid.

14. A wafer processing film according to claim 1 wherein said base film is prepared from a resin and said resin is a material selected from the group consisting of polyethylene, ethylene copolymer, polypropylene and plasticized polyvinyl chloride.

15. A wafer processing film according to claim 14 wherein said ethylene copolymer is an ethylene-vinyl acetate copolymer.

16. A wafer processing film according to claim 1 wherein said base film has a thickness in the range from 10 to 2000 μm.

17. A wafer processing film according to claim 1 wherein the amount of said pressure-sensitive adhesive layer coating is in the range from 1 to 200 g/m$^2$.

18. A wafer processing film according to claim 1 wherein said release film is prepared from a resin and said resin is a material selected from a group consisting of polyolefin, polyester and polyamide.

19. A wafer processing film according to claim 1 from 10 to 500 μm.

20. A wafer processing film according to claim 1 wherein a nonionic surface active agent is added to said phosphoric acid base surfactant in an amount not exceeding 50 parts by weight per 100 parts by weight of said phosphoric acid base surfactant.

21. A wafer processing film according to claim 1 wherein the detection limit of the ionic components by ion chromatography is 1 ppm by weight.

22. A wafer processing film according to claim 1 wherein said surfactant on said second side is in an amount of from 0.5 to 1000 mg/m$^2$.

* * * * *